United States Patent
Cejka et al.

(10) Patent No.: US 9,377,504 B2
(45) Date of Patent: Jun. 28, 2016

(54) INTEGRATED CIRCUIT INTERCONNECT CRACK MONITOR CIRCUIT

(71) Applicants: Stanley A. Cejka, Cedar Park, TX (US); Steven A. Atherton, Austin, TX (US); William J. Downey, Austin, TX (US); James C. Golab, Austin, TX (US); Brian D. Young, Austin, TX (US)

(72) Inventors: Stanley A. Cejka, Cedar Park, TX (US); Steven A. Atherton, Austin, TX (US); William J. Downey, Austin, TX (US); James C. Golab, Austin, TX (US); Brian D. Young, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/227,225

(22) Filed: Mar. 27, 2014

(65) Prior Publication Data
US 2015/0276854 A1    Oct. 1, 2015

(51) Int. Cl.
*H01L 23/52* (2006.01)
*G01R 31/28* (2006.01)
*H01L 23/00* (2006.01)
*H01L 23/498* (2006.01)

(52) U.S. Cl.
CPC ........ *G01R 31/2818* (2013.01); *G01R 31/2882* (2013.01); *G01R 31/2896* (2013.01); *H01L 24/17* (2013.01); *H01L 23/49816* (2013.01); *H01L 23/562* (2013.01); *H01L 2224/14179* (2013.01); *H01L 2924/30101* (2013.01)

(58) Field of Classification Search
CPC .............................. H01L 23/562; H01L 24/17
See application file for complete search history.

(56) References Cited

U.S. PATENT DOCUMENTS

| | | | |
|---|---|---|---|
| 6,564,986 B1 | 5/2003 | Hsieh | |
| 7,326,859 B2 | 2/2008 | Tay et al. | |
| 7,622,737 B2 | 11/2009 | Farooq et al. | |
| 2009/0058435 A1* | 3/2009 | Nakamura | 324/719 |
| 2011/0182405 A1 | 7/2011 | Lee | |

FOREIGN PATENT DOCUMENTS

| | | |
|---|---|---|
| JP | 2006278946 A | 10/2006 |
| JP | 2007035889 A | 2/2007 |

* cited by examiner

*Primary Examiner* — Trung Q Dang
*Assistant Examiner* — Wasiul Haider

(57) ABSTRACT

A circuit device mounted on a substrate includes a detection circuit that monitors a characteristic of a return signal to determine an integrity of various interconnects of the device.

18 Claims, 7 Drawing Sheets

INTEGRATED CIRCUIT INTERCONNECT CRACK MONITOR CIRCUIT

BACKGROUND

1. Field of the Disclosure

The present disclosure relates to electronic devices, and more specifically to monitoring the integrity of interconnects of electronic devices.

2. Description of the Related Art

Electronic devices can be constructed from elements such as an integrated circuit die mounted on a package substrate that is in turn mounted on a printed circuit board (PCB). Signals of such an electronic device can be communicated between the integrated circuit die, the package substrate, and the printed circuit board by input/output (I/O) interconnects, where the I/O interconnects can be made from conductive materials such as solder. During operation of the electronic device, the elements of the device can be subjected to repeated thermal cycles comprising heating and cooling. Materials used in the construction of the electronic device can expand in response to heating and contract in response to cooling. Different materials can expand and contract by different amounts for a given temperature change, creating stress at interconnects that are connected to different materials. Repeated stress caused by thermal cycles, or other causes, can cause interconnect elements to develop physical flaws, especially those interconnect elements that connect various elements of the electronic device to each other. For example, an I/O interconnect between package substrate and a PCB can develop cracks that degrade performance of the interconnect, and ultimately cause the element to fail, which in turn can cause the electronic device to fail.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

An integrated circuit package can use solder balls to provide an interface to a printed circuit board and to communicate signals between an integrated circuit of the package and the printed circuit board. During a manufacturing process that attaches the package to the printed circuit board, cracks can develop in the solder balls. Further, even when the solder balls are properly formed during manufacturing cracks, or other defects, can develop due to thermal expansion/contraction of materials during operation of the integrated circuit. Other components of a larger electronic device that includes the integrated circuit, integrated circuit package and printed circuit board can also expand and contract leading to cracks in solder balls.

The thermal expansion/contraction is problematic due to the materials used in a substrate of the integrated circuit package, in the solder balls, and in the printed circuit board having different coefficients of thermal expansion. Thus, these materials can expand and contract differently. Differing expansion and contraction among materials in an electronic device can create cracks in the solder balls, and cause existing cracks to enlarge. Cracks in a solder ball can change the resistance of the solder ball, and can, therefore, cause the solder ball to fail to communicate signals as intended. These changes in resistance can be used to determine that the solder ball has failed or to predict that a the solder ball is likely to fail in the future.

According to an embodiment of the present invention, a solder ball can be monitored for changes in resistance. Increases in resistance can be monitored and taken as an indicator that the solder ball may fail in the near future. In an embodiment, a warning that solder balls on an integrated circuit package may fail is generated in response to an increase in a resistance in a solder ball that is otherwise relatively insensitive to changes in resistance in all of a plurality of solder balls, for example due to temperature, thus easing detection. Specific embodiments will be better understood with reference to FIGS. 1-7.

Figure 1:
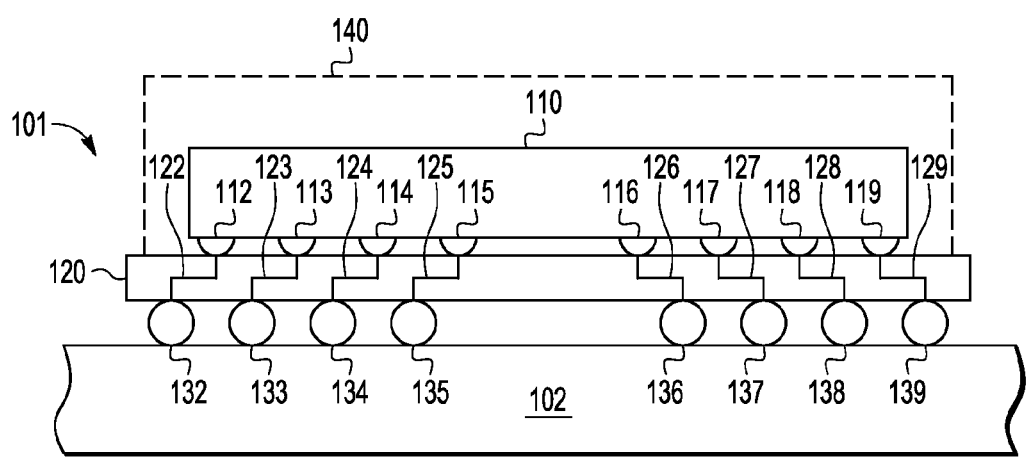
FIG. 1 includes an illustration of a side view of an exemplary electronic device.

FIG. 1 shows a side view of electronic device 100 comprising a packaged integrated circuit device 101 mounted on a printed circuit board 102. The packaged integrated circuit device 101 includes integrated circuit die 110 mounted on integrated circuit package substrate 120, a package lid 140, and external package interconnects 132-139. The IC package substrate 120 includes provides a structural foundation for electrical terminals of the substrate that are used to carry signals between the IC die 110 and the external package interconnects 132-139. An IC package substrate be a patterned substrate, an interposer, a build-up substrate, a metal lead frame, other types of structures, and combinations thereof for providing a structural foundation of an IC die and for communicating signals between the input/output terminals of an integrated circuit die and corresponding external package interconnects of an IC package. For example, a patterned substrate can include an insulating material upon which metal features are disposed, while a lead frame can include metal features without an insulating component. The external package interconnects 132-139 can include conductive pins, balls, lands, the like and combinations thereof.

Signals are communicated from IC die 110 to connections of the IC package substrate by contacts 112-119. Unless otherwise indicated herein, by way of example the contacts 112-119 are presumed to be conductive bumps, e.g., solder bumps, disposed at conductive pads of IC die 110, and therefore are, therefore, I/O interconnects of IC die 110. The term "IO interconnect" with respect to a particular element of an electronic device is intended to refer to a portion of that element to which a conductive structure is attached in order to provide an electrical connection between that element and a different element. Examples of I/O interconnects include conductive bumps, conductive lands, and the like. Thus, contacts 112-119 are IO interconnects of IC die 110.

I/O interconnects can be directly or indirectly connected to other I/O interconnects. For example, a die having an I/O interconnect that is a solder bump can be directly attached to I/O interconnects of a package substrate having conductive lands; or a die having an I/O interconnect that is a conductive land can be indirectly attached to I/O interconnects of a package substrate via bonding wires. As used herein, the term "conductive node" is intended to mean one or more passive elements, such as intralevel metal traces and interlevel vias of a semiconductor device, through which a signal is propagated. The specific examples illustrated are described with respect to a detection circuit of an IC die that is connected to I/O interconnects of the IC die through conductive nodes, it will be appreciated that in other embodiments, that the connections can be made through a series of conductive nodes separated by active devices, such as signal drivers.

According to a specific embodiment, the contacts 112-119 are solder bumps, and can be referred to herein as solder bumps 112-119. Solder used for solder bumps can be any metallic alloy known in the art suited to solder bump applications, and can be a lead based solder alloy or a non-lead based solder alloy. Examples of solder alloys that can be used for solder bumps include eutectic 63% Sn-37% Pb, Sn-3.5Ag, and Sn-0.7Cu. In other various embodiments, contacts 112-119 can be gold balls, electrically conductive polymer contacts, and the like.

FIG. 1 illustrates a flip-chip bonding method in which the I/O interconnects of the IC die are solder bumps 112-119 at an active surface of the IC die 110 that connect directly to conductive lands on IC package substrate 120. In other embodiments, other methods of communicating signals from an IC die to an IC package can be used. For example, bonding wires between bond pads at the IC die and corresponding lands at the substrate can be used. One technique for attaching a bonding wire to an IC die is by means of a wire ball bond. A wire ball bond is created using electrical energy, thermal energy, ultrasonic energy, or a combination thereof to substantially weld the bond wire to the metal bond pad of the IC die. Other wire bonding techniques include wedge bonding, ribbon bonding, and the like.

IC package substrate 120 communicates signals between IC die 110 and printed circuit board 102 by conductive nodes 122-129 and solder balls 132-139. By way of example, solder balls 132-139 are presumed to be I/O interconnects of package substrate 120 that are connected to conductive nodes 122-129, respectively, and subsequently attached to conductive lands at PCB 102. Solder balls 132-139 can be composed of any solder alloy known in the art. For example, solder balls can be made using an alloy of 95.5% tin, 3.9% silver and 0.6% copper ($Sn_{95.9}Ag_{3.9}Cu_{0.6}$).

As discussed previously, a manufacturing process that attaches solder balls 132-139 to printed circuit board 102 can cause cracks to develop in solder balls 132-139. Further, even when the solder balls 132-139 are properly formed during manufacturing, defects, such as cracks, can develop due to thermal expansion/contraction of materials during operation of the IC die 110. Other components of a larger electronic device that includes the packaged IC 101 can also expand and contract leading to cracks in solder balls 132-139.

Further, differing expansion and contraction among materials in an electronic device can create or enlarge cracks in solder balls 132-139. Expansion and contraction can also create or enlarge cracks at solder bumps 112-119. Cracks in a solder balls or solder bumps can change the resistances of the balls or bumps, which can cause balls or bumps to fail to communicate signals as intended. Changes in resistance can be used to determine that a particular solder ball or solder bump has failed or to predict that a particular solder ball or solder bump is likely to fail in the future.

IO interconnects of a device, presumed to be solder balls by way of example, located in areas of greater stress can fail in response to fewer thermal cycles than solder balls located in areas of less stress on the IC package. In an embodiment, solder balls located near the corners of an IC die or package are subject to greater stress than solder balls located near the center, thus solder balls located near a corner can be expected to fail before solder balls located further from the corner.

Signal paths between IC die 110 and PCB 102 can contain elements in addition to solder balls. For example, die contact 112, conductive node 122 and solder ball 132 form a communication path that can transmit a signal between IC die 110 and PCB 102. The techniques disclosed herein can detect changes in resistance amongst communication paths. More generally, an electronic system can comprise elements in addition to IC die 110, package substrate 121 and PCB 102 as depicted at FIG. 1. Signals can be communicated to the additional elements using additional interconnects and conductive nodes. Embodiments of the present disclosure can be used to detect changes in the resistance of communication paths comprising an arbitrary number of I/O interconnects and conductive nodes. For example, PCB 102 can be mounted on another assembly comprising I/O interconnects and conductive nodes. Signals can be communicated using the I/O interconnects and conductive nodes of the other assembly (not shown). For example, a communication path comprising die contact 112, conductive node 122 and solder ball 132 can further comprise a conductive node on PCB 102, an I/O interconnect between the other assembly and PCB 102, and a conductive node on the other assembly.

Figure 2:
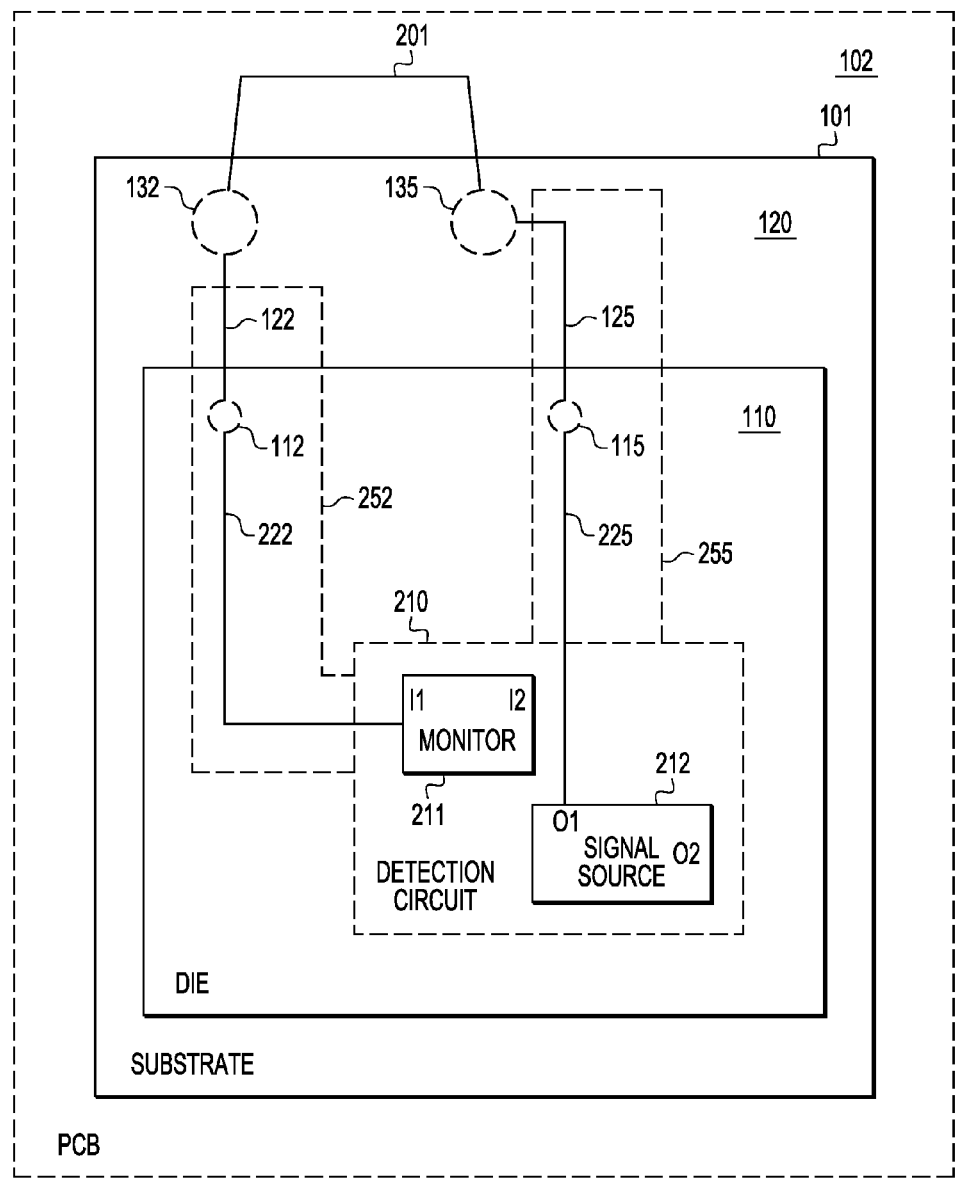
FIG. 2 is a diagram of an overhead view and block diagram of an exemplary electronic device according an embodiment of the present disclosure.

FIG. 2 shows an overhead view diagram of various portions of the electronic device 100 of FIG. 1 in accordance with a particular embodiment. Elements of FIG. 2 having corresponding elements illustrated in FIG. 1 are similarly numbered. In the embodiment illustrated at FIG. 2, IC die 110 further includes conductive nodes 222 and 225, and detection circuit 210. Signals are communicated between the printed circuit board 102 and the IC die 110 through communication paths 252 and 255, and through solder balls 132 and 135. Communication path 252 includes conductive node 222, I/O interconnect 112 and conductive node 122. Communication path 255 includes conductive trace 225, I/O interconnect 115 and conductive node 125. Printed circuit board 102 includes communication path 201. Communication path 201 is connected to solder balls 132 and 135.

Detection circuit 210 includes monitor circuit 211 and signal source 212. Signal source 212 is a circuit that generates an integrity check signal that is provided to output O1. Output O1 of signal source 212 is connected to solder ball 135 by communication path 255. Monitor circuit 211 is a circuit that can detect a change in resistance of a communication path, and includes an input I1 that is connected to solder ball 132 by communication path 252. Signal source 212 provides an integrity check signal at output O1 for checking the integrity of interconnect elements connecting IC die 110 to PCB 102. An integrity check signal provided by signal source 212 at output O1 is communicated to input I1 of monitor circuit 211 through a plurality of elements comprising communication path 255, solder ball 135, conductive node 201, solder ball 132 and communication path 252. Monitor circuit 211 determines an integrity of the plurality of elements based upon an integrity characteristic that is determined based on the received integrity check signal. The integrity characteristic is indicative of a change of resistance along the communication path.

The integrity characteristic can be voltage based, current based, time based, the like, and combinations thereof. For example, monitor circuit 211 can determine a voltage-based integrity characteristic that is the voltage received at I1 for a given signal provided to O1. Monitor circuit 211 can determine a voltage-based integrity characteristic that is the difference between voltage of the received integrity check signal (the signal received at input I1) and the voltage of the transmitted integrity check signal (the signal at output O1). Monitor circuit 211 can determine a current-based integrity characteristic that is the amount of current received at the input I1 for a given signal provided to O1. Monitor circuit 211 can determine a current-based integrity characteristic that is the difference between an amount of current received at the input I1 for a given signal provided to O1. Monitor circuit 211 can determine a time-based integrity characteristic that is the change over time of a current-based or voltage-based integrity characteristic.

In an embodiment, signal source 212 provides an integrity check signal at O1 having a particular voltage, and the monitor circuit determines a received voltage at its input I1. Detection circuit 210 can determine that the integrity of the device is suspect if the voltage at input I1 does not meet a threshold voltage that is representative of a minimum or maximum voltage value. For example, the threshold voltage can be a voltage that is determined to result when a desired resistance of the data path between O1 and I1 is too high or too low. In another embodiment, the detection circuit can monitor changes in the voltage at input I1 over time, e.g., by storing values, and determine a device is failing in response to a threshold defined by this change over time.

As discussed in regard to FIG. 1, a solder ball crack can cause increased resistance of the solder ball. Thus, detecting integrity characteristics that correspond to increasing resistance of the plurality of elements can be used to determine the presence of cracks, or other flaws, in an element of the plurality of elements. In an embodiment, a bit in a status register is set in response to detection circuit 210 is set in response to the integrity characteristic meeting a failure threshold.

It will be appreciated that integrity check characteristics other than voltages can be used. For example, in an embodiment, signal source 212 provides a constant current signal at output O1, and monitor circuit 211 determines over time a plurality of values of differences in voltages at I1, or differences between the current of the provided integrity check signal and the current of a signal at input I1. As will be discussed in greater detail later, values of resistance differences can be stored and retrieved at a later time. A sufficiently large difference between a later value and an earlier value can indicate that the plurality of components of a path is leaking current and that signal integrity along a communication path is failing or subject to failure.

In an embodiment, the integrity check characteristic can be a change in signal characteristic, such as voltage. For example, signal source 212 can provide an integrity check signal that is a step function signal at output O1. The electrical characteristics of the plurality of elements of a communication path can modify parameters of the step function signal as it passes through the plurality of elements. For example, the rise time of a transition of an integrity check signal from a low voltage to a high voltage can be increased by the electrical characteristics of the plurality of circuit elements. As such, monitor circuit 211 can compare the rise time of the signal at the input I1 with the rise time of the integrity check signal provided by the signal source 212 at output O1 or with an expected rise time. An increase in resistance in the plurality of circuit elements due to a flaw in a circuit element, for example a cracked I/O interconnect, can cause the rise time of the step function to increase. In an embodiment, signal source 212 provides a periodic signal at output O1. For example, signal source 212 can provide a sine wave as an integrity check signal. As discussed with respect to a step function integrity check signal, electrical characteristics of the plurality of elements can change characteristics of the periodic signal. For example, resistance and capacitance of elements of the plurality of circuit elements can change the amplitude and phase of a sine wave integrity check signal. Monitor circuit 211 can compare the amplitude and phase of a periodic signal at input I1 with the amplitude and phase of the periodic integrity check signal as provided by signal source 212 at output O1.

As discussed with respect to FIG. 1, the resistance of an I/O interconnect can vary with temperature. Embodiments of the present disclosure discussed with respect to FIG. 2 may be sensitive to changes in resistance of I/O interconnects due to temperature as well as to changes in resistance due to cracks. In other embodiments of FIG. 2, the integrity characteristic monitored by detection circuit 210 can be independent of temperature. Thus, a bridge circuit, such as that shown in FIG. 3, comprising more than two I/O interconnects can detect changes of resistances of I/O interconnects, independent of temperature, with a single signal source and monitor circuit.

Figure 3:
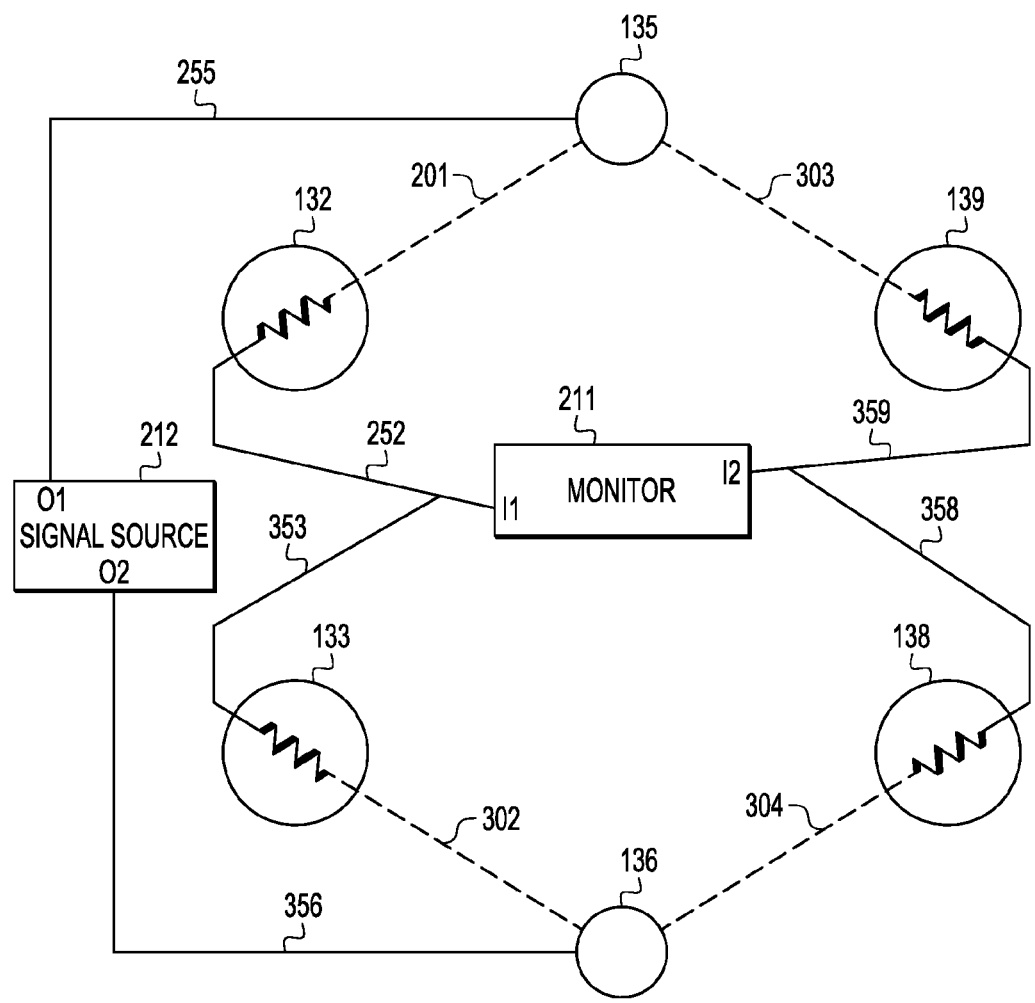
FIG. 3 is a schematic diagram of a bridge circuit comprising I/O interconnects according to an embodiment of the present disclosure.

FIG. 3 shows a schematic diagram of a bridge circuit 300 suitable for monitoring resistance of I/O interconnects of a packaged IC. Elements of FIG. 3 having corresponding elements in FIGS. 1 and 2 are similarly numbered. The bridge circuit 300 includes solder balls 132, 133, 138 and 139 as resistors of the bridge circuit. Bridge circuit 300 further includes communication paths 252, 353, 358 and 359 connecting solder balls 132, 133, 138 and 139, respectively, to monitor circuit 211. Bridge circuit 300 further includes solder ball 135 and conductive nodes 201 and 303 to communicate an integrity check signal from output O1 of monitor circuit 212 to solder balls 132 and 139. Bridge circuit 300 further includes solder ball 136 and conductive nodes 302 and 304 to communicate an integrity check signal from output O2 of monitor circuit 212 to solder balls 133 and 138. Signal source 212 further includes output O2. In operation, signal source 212 applies an integrity check voltage between outputs O1 and O2. The integrity check voltage is communicated through communication paths 255 and 356 to solder balls 135 and 136, respectively, and further communicated through conductive nodes 201, 302, 303, and 304 to solder balls 132, 133, 139 and 138, respectively.

Elements of bridge circuit 300 form two voltage divider networks. A first voltage divider network includes conductive node 201, solder ball 132, communication paths 252 and 353, solder ball 133, and conductive node 302. For an integrity test voltage $V_{test}$ applied between solder balls 135 and 136 by signal source 212, the voltage at input I1 of monitor circuit 211 is based on the resistances of solder balls 132 and 133 according to the formula:

$$V_{I1} = V_{test}(R_{133}/(R_{132}+R_{133}))$$ (Formula 1)

where $V_{test}$ is the test voltage, $R_{132}$ is the resistance of solder ball 132 and $R_{133}$ is the resistance of solder ball 133. In this formula, the resistances of communication path 252, communication path 353, conductive node 201 and conductive node 302 are assumed to be negligible.

The bridge circuit illustrated at FIG. 3 is relatively insensitive to equal temperature changes of solder balls. Changes in the resistance of a solder ball due to temperature can be approximated by multiplying the resistance of the ball by a value C(t) that is dependent on the change in temperature and on the temperature coefficient of resistance of the material of which the solder ball is manufactured. When both solder balls 132 and 133 are manufactured from the same material and have the same temperature t, $V_{I1}$ as a function of temperature can be approximated using the formula:

$$V_{I1}=V_{test}(C(t)*R_{133})/(C(t)*R_{132}+C(t)*R_{133}) \quad \text{(Formula 2)}$$

The factors C(t) in the formula cancel, providing the same value for $V_{I1}$ as Formula 1. Thus the value of $V_{I1}$ is approximately independent of changes in resistance affecting both of solder balls 132 and 133, for example changes due to temperature, but is dependent on changes in resistance that are not common to both I/O interconnects. For example, $V_{I1}$ will depend on changes in resistance due to cracks in only one solder ball.

Conductive node 303, solder ball 139, communication paths 359 and 358, solder ball 138 and conductive node 304 form a second voltage divider network. Similar to the first voltage divider network, the voltage at input I2 is relatively insensitive to changes in the resistances of solder balls 138 and 139 due to temperature changes while being sensitive to changes affecting only one of solder balls 138 and 139.

In an embodiment, voltages at inputs I1 and I2 can be measured independently. In an embodiment, a voltage difference between a voltage at input I1 and a voltage at input I2 can be measured. When solder balls 132, 133, 138 and 139 have the same resistance the voltages at inputs I1 and I2 will be the same, and the difference between the voltages will be zero. A packaged IC comprising solder balls 132, 133, 138 and 139 can be functional when the values of the resistances of the solder balls are not identical. In an embodiment, a voltage difference between input I1 and I2 can be measured when the package IC is known to be functioning properly. A value for this voltage difference can be stored, for example in a memory, and retrieved at a later time for comparison to future measurements of the difference in voltage between inputs I1 and I2. In an embodiment, a threshold value can be determined for future voltage difference measurements, such that a future measurement that differs from a stored measurement by more than the threshold value indicates an error condition.

In other various embodiments, elements of the bridge circuit 300 can be located on IC die 110, package substrate 121 and PCB 102 in configurations other than illustrated at FIG. 2. For example, in an embodiment monitor circuit 211 and conductive paths 252, 353, 358 and 359 can be located on the PCB 102. Signal source 212 can provide an integrity test signal through conductive nodes on IC die 110 instead of through solder balls 135-136 and conductive nodes 201 and 302-304.

Bridge circuit 300 consumes power when signal source 212 applies an integrity test voltage. It may be desirable to apply a voltage across the bridge circuit only when a measurement is to be made. In an embodiment, a voltage across the bridge circuit is removed after a measurement has been made. A voltage can be applied at a future time when another measurement is to be made. In an embodiment, measurements can be made intermittently. For example, a measurement can be made whenever power is applied to an electronic device comprising bridge circuit 300. In another embodiment measurements can be made periodically, for example daily or hourly. In an embodiment, a measurement can be made in response to an electronic system comprising bridge circuit 300 detecting an error or a change in system performance.

Figure 4:
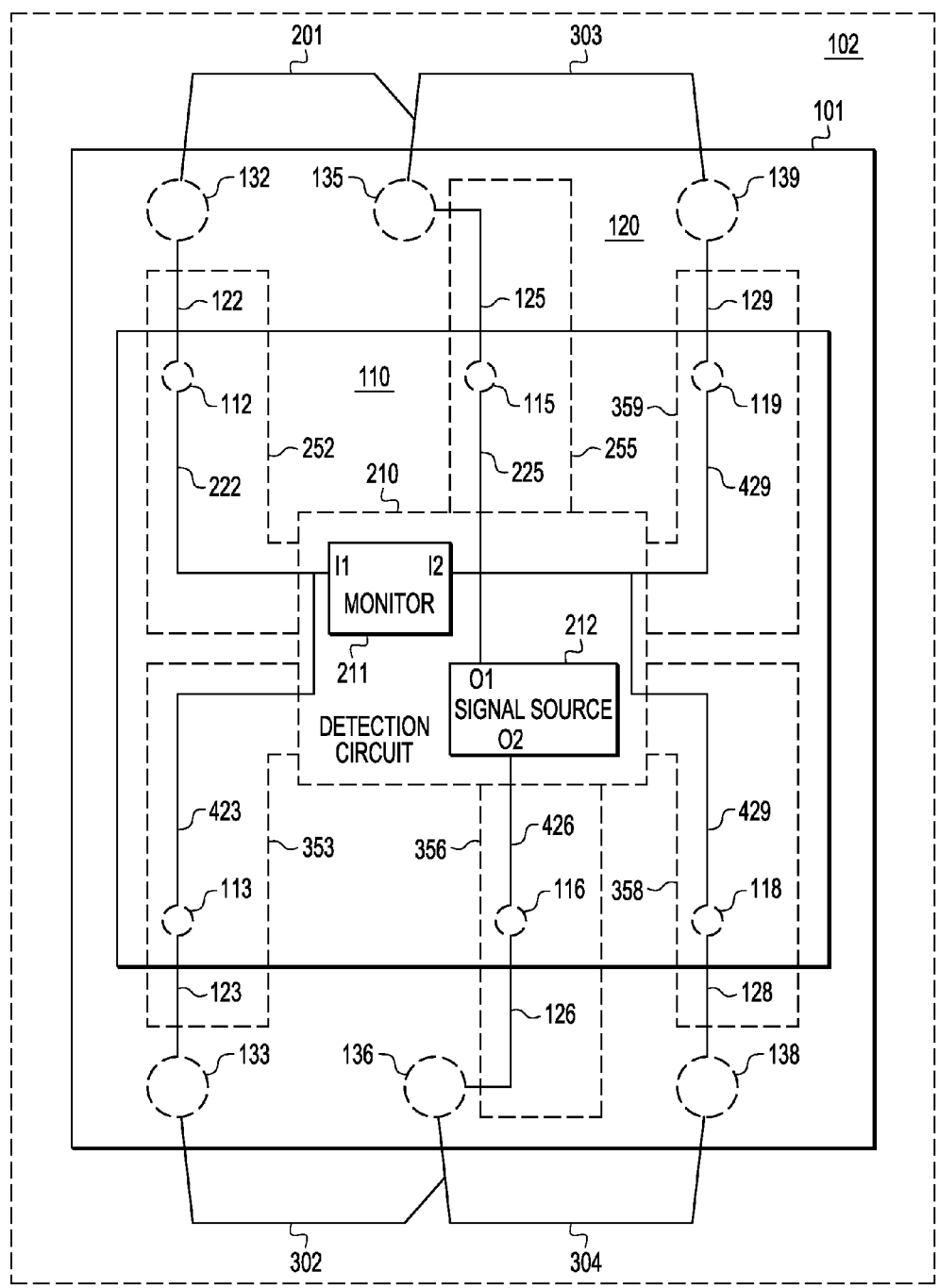
FIG. 4 is a diagram of an overhead view and block diagram of an electronic device according to another embodiment of the present disclosure.

FIG. 4 illustrates an overhead view diagram of various portions of the electronic device of FIG. 1 in accordance with another particular embodiment. The device illustrated at FIG. 4 has a monitor circuit comprising I/O interconnects connected in a bridge circuit configuration. Elements of FIG. 4 having corresponding elements illustrated in FIGS. 1, 2 and 3 are similarly numbered. In the embodiment illustrated at FIG. 4, IC die further includes conductive nodes 423, 426, 428 and 429. Signals are further communicated between printed circuit board 102 and IC die 110 through communication paths 353, 356, 358, and 359. Communication path 353 includes conductive node 423, I/O interconnect 113 and conductive node 123. Communication path 356 includes conductive node 426, I/O interconnect 116 and conductive node 126. Communication path 358 includes conductive node 428, I/O interconnect 119 and conductive node 128. Communication path 359 includes conductive node 429, I/O interconnect 118 and conductive node 129. Printed circuit board 102 further includes communication paths 302, 303 and 304. Communication path 302 is connected to solder balls 133 and 136. Communication path 303 is connected to solder balls 135 and 139. Communication path 304 is connected to solder balls 136 and 138.

Input I1 of monitor circuit 211 is further connected to solder ball 133 by communication path 353. Monitor circuit 211 further includes a second input I2. Input I2 is connected to solder ball 138 by communication path 358 and to solder ball 139 by communication path 359. Signal source 212 further includes a second output O2. Output O2 is connected to solder ball 136 by communication path 356. Signal source 212 provides an integrity check signal at outputs O1 and O2 for checking the integrity of interconnect elements connecting IC die 110 to PCB 102.

The electronic device illustrated at FIG. 4 is operated as a bridge circuit as discussed with respect to FIG. 3. Signal source 212 applies a constant voltage to the bridge circuit. Solder balls 132, 133, 138 and 139 are resistors of the bridge circuit. The bridge circuit illustrated at FIG. 4 has multiple communication paths that are verified by the bridge circuit (verified communication paths) The first verified communication path includes conductive node 255, I/O interconnect 135, conductive node 201, I/O interconnect 132, conductive nodes 252 and 353, I/O interconnect 133, conductive node 302, I/O interconnect 136 and conductive node 356. The second verified communication path includes conductive node 255, I/O interconnect 135, conductive node 303, I/O interconnect 139, conductive nodes 359 and 358, I/O interconnect 138, conductive node 304, I/O interconnect 136 and conductive node 356. Monitor circuit 211 measures a difference in voltage between two branches of the bridge circuit at inputs I1 and I2. Changes in the difference in voltage between the two branches can indicate a change in resistance of one or more solder balls 132, 133, 138 and 139 due to flaws, for example cracks, in the solder balls.

Figure 5:
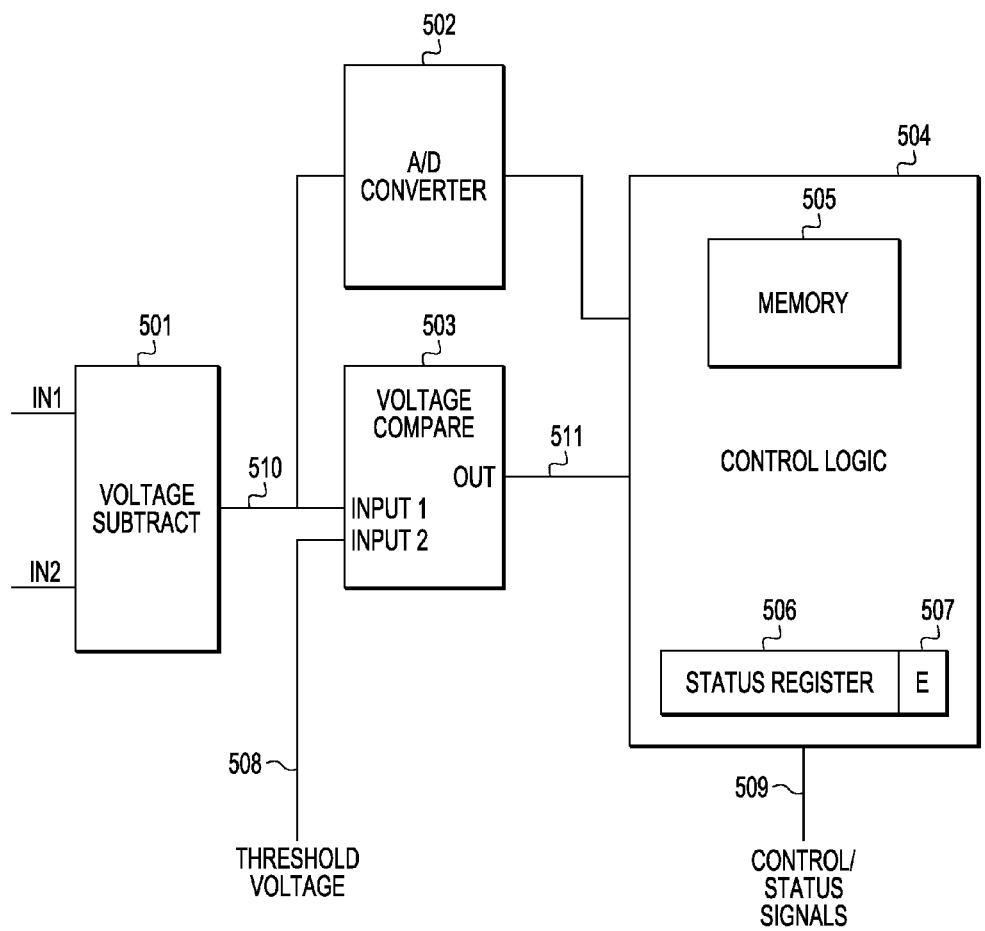
FIG. 5 is a block diagram of a monitor circuit according to an embodiment of the present disclosure.

FIG. 5 shows a block diagram of monitor circuit 211 according to an embodiment of the present disclosure. Monitor circuit 211 includes voltage subtract circuit 501, A/D converter 502, voltage compare circuit 503 and control logic 504. Voltage compare circuit 503 includes inputs Input 1 and Input 2. Voltage subtract circuit 501 includes a first input I1 and a second input I2. Voltage subtract circuit 501 generates a difference signal 510 having a voltage based on the difference between a voltage at first input I1 and a voltage at second input I2. Difference signal 510 is connected to Input 1 of voltage compare circuit 503. Threshold voltage signal 508 is connected to Input 2 of voltage compare circuit 503. Voltage compare circuit 503 compares difference signal 510 at Input 1 to threshold voltage signal 508 at Input 2. When the voltage indicated by difference signal 510 exceeds the voltage indicated by threshold voltage signal 508, voltage compare circuit 503 signals an error condition to control logic 504 by error condition signal 511. Upon receiving an error condition signal from voltage compare circuit 503, control logic 504 can set flag bit 507 in status register 506.

In an embodiment, a voltage of difference signal 510 can be converted to a digital representation by A/D converter 502. The digital representation can be stored by control logic 504 in memory 505. Control logic 504 can retrieve the digital representation from memory and provide the digital representation to other circuits on an IC die via control/status signals 509. In an embodiment, control logic can provide the stored value of the digital representation from a register (not shown) accessible on a data bus of the IC die.

In an embodiment, threshold voltage signal 508 can be a constant voltage set by circuit elements. For example, threshold voltage signal 508 can be set using a voltage divider circuit comprising two resistors. In an embodiment, threshold voltage signal 508 can be the output of a digital-to-analog (D/A) converter circuit (not shown). In an embodiment, an input of a D/A converter circuit setting threshold voltage signal 508 can be set by a processor executing a software program. In an embodiment, an input of a D/A converter setting threshold voltage signal 508 can be set by control logic 504. In an embodiment, the value of threshold value signal 508 can be based on a previously determined value of difference signal 510. In an embodiment, the value of threshold value signal 508 is based on a plurality of previously determined values of difference signal 510. In an embodiment, the value of threshold value signal 508 is based on an average of previously determined values of difference signal 510. In an embodiment, the plurality of previously determined values of difference signal 510 is determined during a manufacturing test. In an embodiment, the plurality of previously determined values of difference signal 510 includes a predetermined number of previously determined values.

In an embodiment, control logic 504 determines a plurality of values of threshold voltage signal 508. Each value of the plurality of values can be applied to Input 2 of voltage compare circuit 503 in succession. The error output generated by voltage compare circuit 503 for each value of threshold signal 508 can be stored in memory 505 by control logic 504. Control logic 504 can provide the stored error values in additional bits (not shown) of status register 506 and can perform additional functions based on the error output signal 511. In an embodiment, control logic 504 can store, in memory 505, a base value for threshold voltage signal 508 determined during a manufacturing test. Control logic 504 can determine two additional threshold voltage values, the first additional threshold voltage value being greater than the base threshold voltage value and the second additional stored threshold value being greater than the first additional threshold voltage value. The first and second additional threshold voltage values can be stored in memory 505 or can be calculated by control logic 504 when the values are needed. The base threshold voltage value and the two additional threshold voltage values can be applied to threshold voltage signal 508 in succession. When the voltage indicated by difference signal 510 exceeds the base threshold voltage value, control logic 504 can set a bit in a control register 506 indicating a change in the resistance of one or more I/O solder balls 132, 133, 138 and 139. When the voltage indicated by difference signal 510 exceeds the first additional threshold voltage value, as indicated by an error output from voltage compare circuit 503, control logic 504 can set a second bit (not shown) in control register 506 and signal an interrupt to a processing module on the IC die using control/status signals 509. When the voltage indicated by difference signal 510 exceeds the second additional threshold voltage value, as indicated by an error output from voltage compare circuit 503, control logic 504 can set a third bit (not shown) in control register 506 and send a shutdown signal to the processing module using control/status signals 509.

In an embodiment, another module of an IC die, for example a processor, can instruct control logic 504 to select a particular voltage for threshold voltage 508. In an embodiment, a manufacturing test can determine multiple values of threshold voltage 508 and store the values into memory 505.

In addition to interconnects between a package substrate and a printed circuit board, other connections in an electronic system can crack or fail due to thermal stress in a manner similar to solder balls. Elements of the present disclosure can be used to detect cracks or failures of additional types of connections used in electronic system, for example in solder bumps on an IC die.

Figure 6:
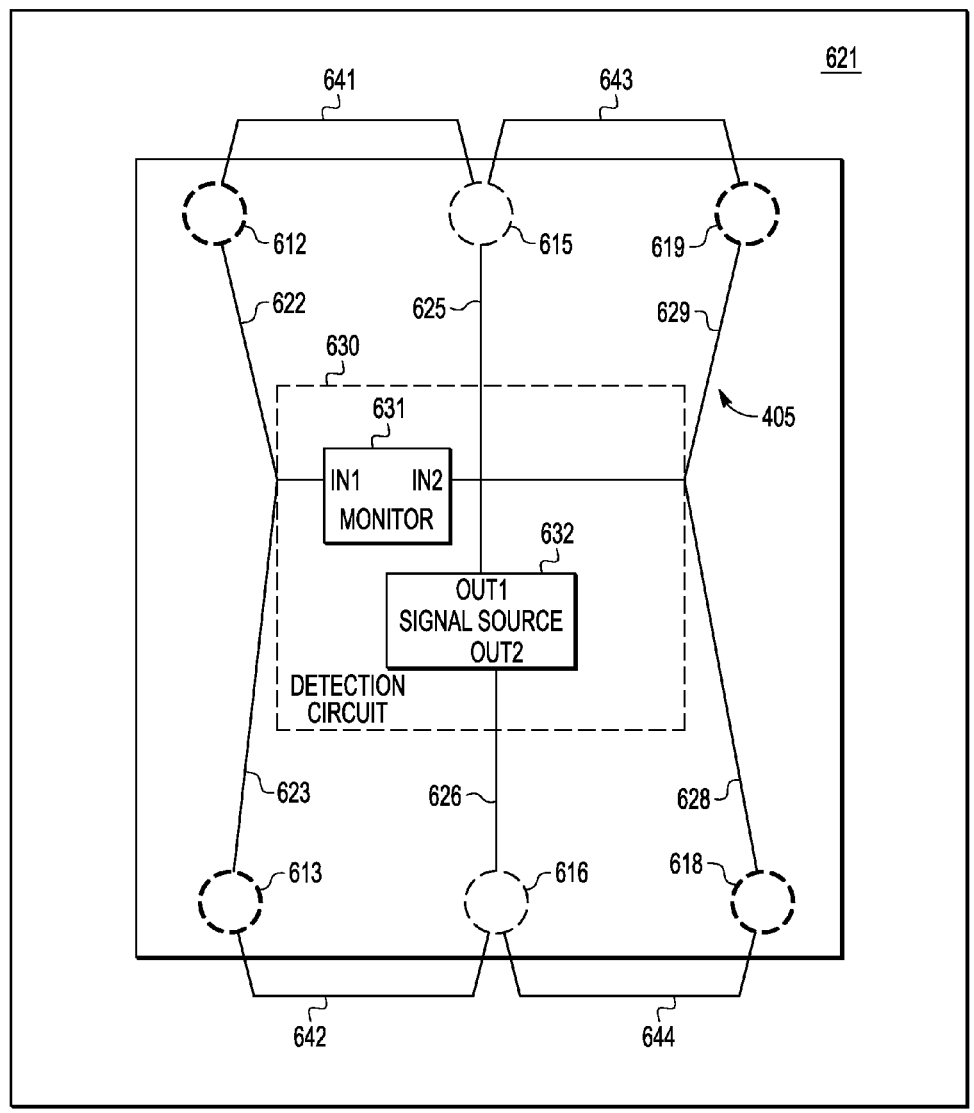
FIG. 6 is a diagram of an overhead view and block diagram of an electronic device according to another embodiment of the present disclosure.

FIG. 6 illustrates an alternate embodiment wherein the die interconnects are specifically tested using techniques similar to those discussed previously. Packaged IC 600 includes an IC die 611 and package substrate 621. IC die 611 includes detection circuit 630, monitor circuit 631 and signal source 632. Monitor circuit 631 detects differences in voltages at inputs I1 and I2 similar to monitor circuit 211 described with respect to FIG. 4. Signal source 632 provides an integrity check signal similar to signal source 212 described with respect to FIG. 4. IC die 611 further includes communication paths 622, 623, 628 and 629 connecting monitor circuit 211 to solder bumps 612, 613, 618 and 619, respectively. IC die 611 further includes communication paths 625 and 626 connecting signal source 212 to solder bumps 615 and 616, respectively. IC die 611 is attached to package substrate 621 by solder bumps 612, 613, 615, 616, 618 and 619 in a flip-chip configuration. Similar to solder balls 132, 133, 138 and 139 as illustrated at FIG. 4, solder bumps 612, 613, 618 and 619 can be connected in a bridge circuit configuration. Package substrate 621 includes communication paths 641-644. Communication paths 641-644 complete the bridge circuit on the package substrate 621 similar to communication paths 201 and 302-304 discussed with respect to FIG. 3. Changes in resistances of solder bumps 612, 613, 618 and 619 can be detected using techniques similar to those used in the detection of changes in the resistances of solder balls 132, 133, 136 and 139 as discussed previously with respect to FIGS. 3 and 4.

Figure 7:
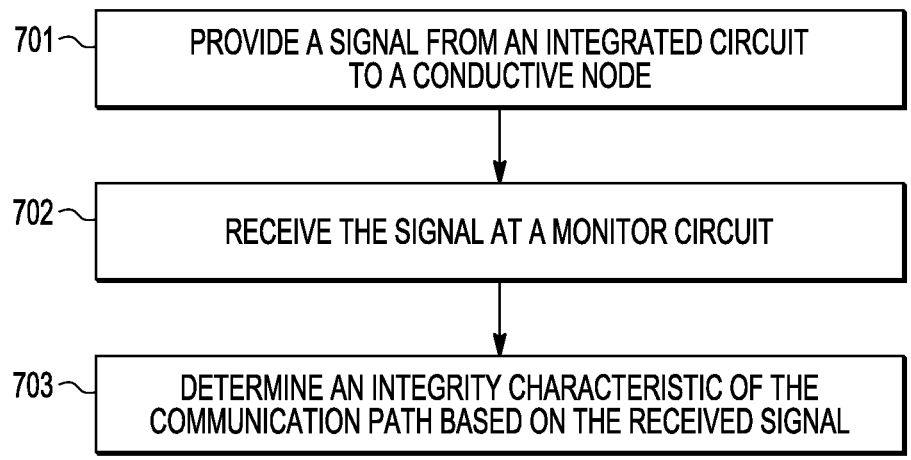
FIG. 7 is a flow diagram of a method for determining the integrity of a communication path including an I/O interconnect according to an embodiment of the present disclosure.

FIG. 7 shows flow diagram 700 of a method for determining the integrity of a communication path in an electronic device according to an embodiment of the present disclosure. At step 701, a signal is provided from an IC to a communication path that includes a conductive node. A conductive node can comprise conductive nodes on the IC, solder bumps on the IC die, bond wires, conductive nodes in a package substrate, solder balls connecting a packaged IC to a printed circuit board, conductive nodes in a printed circuit board, combinations thereof and the like. The signal provided can be a constant voltage signal, a constant current signal, a step function signal, a periodic signal or the like. The signal provided to the conductive node has a characteristic of a predefined value. For example, a constant voltage signal has a predefined voltage value. At step 702 the signal is received at a monitor circuit of the IC from a communication path. The received signal is based upon the signal provided at step 701. The communication path includes a plurality of I/O interconnects. An I/O interconnect can be solder bumps, solder balls, or any type of I/O interconnect known in the art for communicating signals to an IC die. At step 703, the monitor circuit determines an integrity characteristic of the communication path based on the received signal. The received signal has a characteristic of a second value. The second value is based on the predefined value of the characteristic of the provided signal, and on the integrity of the communication path. For example, when the provided signal is a constant voltage signal, the received signal can have a voltage based on the predefined voltage of the provided signal and on the resistance of the communication path.

In a first aspect, a device can include a first I/O interconnect, a second I/O interconnect, and an integrated circuit die including a first conductive node coupled to the first I/O interconnect, a second conductive node coupled to the second I/O interconnect, and a detection circuit including a first output coupled to the first conductive node to provide an integrity check signal, a first input coupled to the second conductive node to receive a first return signal based on the integrity check signal, and a monitor circuit coupled to the first input to determine a first integrity characteristic of a first verified communication path, that includes the second I/O interconnect, based upon the first return signal, the first integrity characteristic being indicative of the integrity of the first verified communication path.

In one embodiment of the first aspect, the device is a packaged device including the first I/O interconnect, the second I/O interconnect, an integrated circuit package substrate to which the integrated circuit die is attached, the integrated circuit package substrate including a third conductive node coupled to the first I/O interconnect, wherein the third conductive node is between the first conductive node and the first I/O interconnect, and a fourth conductive node coupled to the second I/O interconnect; wherein the fourth conductive node is between the second conductive node and the second I/O interconnect.

In another embodiment of the first aspect, the device includes a PCB including a first communication path coupled to the second I/O interconnect and to the first I/O interconnect to communicate the integrity check signal from the first I/O interconnect to the second I/O interconnect. In a further embodiment, the device includes a third I/O interconnect, and a fourth I/O interconnect, wherein the integrated circuit die further includes a third conductive node coupled to the third I/O interconnect, and a fourth conductive node coupled to the first input and to the fourth I/O interconnect. The detection circuit further includes a second output coupled to the third conductive node, and the first verified communication path further includes the fourth I/O interconnect. In a particular embodiment, the device includes a fifth I/O interconnect, and a sixth I/O interconnect. The integrated circuit die further includes a fifth conductive node coupled to the fifth I/O interconnect, and a sixth conductive node coupled to a sixth I/O interconnect. The detection circuit further includes a second input coupled to the fifth conductive node and to the sixth conductive node, wherein the second input receives a second return signal based on the integrity check signal, the monitor circuit is further coupled to the second input to determine a second integrity characteristic of a second verified communication path that includes the fifth I/O interconnect and the sixth I/O interconnect, based upon the second return signal, and the monitor circuit is operable to provide an indication in response to a difference between the first integrity characteristic and the second integrity characteristic being in a particular relationship to a threshold value. In a more particular embodiment, the device is a packaged device including the first, second, third, fourth, fifth, and sixth I/O interconnects, an integrated circuit package substrate to which the integrated circuit die is attached, the integrated circuit package substrate includes a seventh conductive node coupled to the first I/O interconnect, wherein the seventh conductive node is between the first conductive node and the first I/O interconnect, an eighth conductive node coupled to the second I/O interconnect, wherein the eighth conductive node is between the second conductive node and the second I/O interconnect, a ninth conductive node coupled to the third I/O interconnect, wherein the ninth conductive node is between the third conductive node and the third I/O interconnect, a tenth conductive node coupled to the fourth I/O interconnect, wherein the tenth conductive node is between the fourth conductive node and the fourth I/O interconnect, an eleventh conductive node coupled to the fifth I/O interconnect, wherein the eleventh conductive node is between the fifth conductive node and the fifth I/O interconnect, and a twelfth conductive node coupled to the sixth I/O interconnect, wherein the twelfth conductive node is between the sixth conductive node and the sixth I/O interconnect. In an even more particular embodiment, a printed circuit board (PCB) to which the packaged device is attached, the PCB includes a thirteenth conductive node coupled to the first I/O interconnect, to the second I/O interconnect and to the fifth I/O interconnect, to communicate the integrity check signal from the first I/O interconnect to the second I/O interconnect and to the fifth I/O interconnect, and a fourteenth conductive node coupled to the third I/O interconnect, to the fourth I/O interconnect and to the sixth I/O interconnect to communicate the integrity check signal from the third I/O interconnect to the fourth I/O interconnect and to the sixth I/O interconnect. In an even further particular embodiment, the fourteenth conductive node is further coupled to electrical ground. In another even more particular embodiment, the first I/O interconnect comprises solder. In a further even more particular embodiment, the second, fourth, fifth and sixth I/O interconnects are substantially at corners of the packaged integrated circuit device.

In a second aspect, a method can include providing, at an integrated circuit die, a first signal to a first conductive node, the first signal having a characteristic of a predefined first value, receiving a second signal, based on the first signal, at a first input of a monitor circuit at the integrated circuit die, via a first communication path comprising a first I/O interconnect, the second signal having the characteristic of a second value, and determining, at the monitor circuit, a first integrity characteristic based upon the second value, the first integrity characteristic being indicative of the integrity of the first communication path.

In one embodiment of the second aspect, the method includes determining the first integrity characteristic is based upon a comparison of the first value and the second value. In another embodiment, the method includes storing a stored value at the integrated circuit die prior to receiving the second signal, and wherein determining the first integrity characteristic is based upon a comparison of the first value to the stored value. In a further embodiment, the method includes in response to the first integrity characteristic being in a particular relationship to a threshold value, providing an indication that a resistance the first communication path is greater than a predetermined resistance value.

In yet another embodiment of the second aspect, the method includes providing the first signal to a second conductive node, receiving a third signal, based on the first signal, at a second input of the monitor circuit, via a second communication path comprising a second I/O interconnect, the third signal having the characteristic of a third value, wherein the first integrity characteristic is further based on the third value and is further indicative of an integrity of the first and second communication paths. In a particular embodiment, the first integrity characteristic is based upon a relationship between the second value and the third value. In a more particular embodiment, the first integrity characteristic is further based on a comparison of the second value to a predefined value.

In yet another embodiment of the second aspect, the characteristic is voltage. In yet a further embodiment, the characteristic is current. In still another embodiment, the characteristic is a time characteristic.

In a third aspect, a system can include a packaged integrated circuit including a voltage source coupled to a first solder ball and to a second solder ball, a first conductive path coupled to a third solder ball, to a fourth solder ball, and to a first input of a voltage compare circuit, a second conductive path coupled to a fifth solder ball, to a sixth solder ball, and to a second input of the voltage compare circuit, and a printed circuit board including a third conductive path coupled to the first solder ball, the third solder ball and the fifth solder ball, and a fourth conducive path coupled to the second solder ball, the fourth solder ball and the sixth solder ball.

In one embodiment of the third aspect, the third, fourth, fifth and sixth solder balls are substantially at corners of a substrate of the packaged integrated circuit.

The specification and drawings should be considered exemplary only, and the scope of the disclosure is accordingly intended to be limited only by the following claims and equivalents thereof. Other embodiments, uses, and advantages of the disclosure will be apparent to those skilled in the art from consideration of the specification and practice of the disclosure disclosed herein.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

What is claimed is:

1. A device, comprising:
    a first I/O interconnect;
    a second I/O interconnect;
    a third I/O interconnect;
    a fourth I/O interconnect and
    an integrated circuit die comprising
        a first conductive node coupled to the first I/O interconnect;
        a second conductive node coupled to the second I/O interconnect;
        a third conductive node coupled to the third I/O interconnect and
        a fourth conductive node coupled to the first input and to the fourth I/O interconnect; and
        a detection circuit comprising
            a first output coupled to the first conductive node to provide an integrity check signal;
            a second output coupled to the third conductive node;
            a first input coupled to the second conductive node to receive a first return signal based on the integrity check signal; and
            a monitor circuit coupled to the first input to determine a first integrity characteristic of a first verified communication path, that includes the second I/O interconnect and the fourth I/O interconnect, based upon the first return signal, the first integrity characteristic being indicative of the integrity of the first verified communication path.

2. The device of claim 1, wherein the device is a packaged device comprising:
    the first I/O interconnect;
    the second I/O interconnect;
    an integrated circuit package substrate to which the integrated circuit die is attached, the integrated circuit package substrate comprising:
        a third conductive node coupled to the first I/O interconnect, wherein the third conductive node is between the first conductive node and the first I/O interconnect; and
        a fourth conductive node coupled to the second I/O interconnect; wherein the fourth conductive node is between the second conductive node and the second I/O interconnect.

3. The device of claim 2, further comprising:
    a PCB comprising:
        a first communication path coupled to the second I/O interconnect and to the first I/O interconnect to communicate the integrity check signal from the first I/O interconnect to the second I/O interconnect.

4. The device of claim 1, further comprising:
    a fifth I/O interconnect; and
    a sixth I/O interconnect; wherein:
    the integrated circuit die further comprises:
        a fifth conductive node coupled to the fifth I/O interconnect; and
        a sixth conductive node coupled to a sixth I/O interconnect;
    the detection circuit further comprises:
        a second input coupled to the fifth conductive node and to the sixth conductive node, wherein the second input receives a second return signal based on the integrity check signal;
        the monitor circuit is further coupled to the second input to determine a second integrity characteristic of a second verified communication path that includes the fifth I/O interconnect and the sixth I/O interconnect, based upon the second return signal; and
    the monitor circuit is operable to provide an indication in response to a difference between the first integrity characteristic and the second integrity characteristic being in a particular relationship to a threshold value.

5. The device of claim 1, wherein the device is a packaged device comprising:
    the first, second, third, fourth, fifth, and sixth I/O interconnects;
    an integrated circuit package substrate to which the integrated circuit die is attached, the integrated circuit package substrate comprising:
        a seventh conductive node coupled to the first I/O interconnect, wherein the seventh conductive node is between the first conductive node and the first I/O interconnect;
        an eighth conductive node coupled to the second I/O interconnect, wherein the eighth conductive node is between the second conductive node and the second I/O interconnect;
        a ninth conductive node coupled to the third I/O interconnect, wherein the ninth conductive node is between the third conductive node and the third I/O interconnect;

a tenth conductive node coupled to the fourth I/O interconnect, wherein the tenth conductive node is between the fourth conductive node and the fourth I/O interconnect;
an eleventh conductive node coupled to the fifth I/O interconnect, wherein the eleventh conductive node is between the fifth conductive node and the fifth I/O interconnect; and
a twelfth conductive node coupled to the sixth I/O interconnect, wherein the twelfth conductive node is between the sixth conductive node and the sixth I/O interconnect.

6. The device of claim 5, further comprising:
a printed circuit board (PCB) to which the packaged device is attached, the PCB comprising:
a thirteenth conductive node coupled to the first I/O interconnect, to the second I/O interconnect and to the fifth I/O interconnect, to communicate the integrity check signal from the first I/O interconnect to the second I/O interconnect and to the fifth I/O interconnect; and
a fourteenth conductive node coupled to the third I/O interconnect, to the fourth I/O interconnect and to the sixth I/O interconnect to communicate the integrity check signal from the third I/O interconnect to the fourth I/O interconnect and to the sixth I/O interconnect.

7. The device of claim 6, wherein:
the fourteenth conductive node is further coupled to electrical ground.

8. The device of claim 5, wherein the second, fourth, fifth and sixth I/O interconnects are substantially at corners of the packaged integrated circuit device.

9. The device of claim 4, wherein the device is a packaged device comprising:
the first I/O interconnect;
the second I/O interconnect;
an integrated circuit package substrate to which the integrated circuit die is attached, the integrated circuit package substrate comprising:
a third conductive node coupled to the first I/O interconnect, wherein the third conductive node is between the first conductive node and the first I/O interconnect; and
a fourth conductive node coupled to the second I/O interconnect; wherein the fourth conductive node is between the second conductive node and the second I/O interconnect.

10. The device of claim 9, further comprising:
a PCB comprising:
a first communication path coupled to the second I/O interconnect and to the first I/O interconnect to communicate the integrity check signal from the first I/O interconnect to the second I/O interconnect.

11. The device of claim 5, wherein the device is a packaged device comprising:
the first I/O interconnect;
the second I/O interconnect;
an integrated circuit package substrate to which the integrated circuit die is attached, the integrated circuit package substrate comprising:
a third conductive node coupled to the first I/O interconnect, wherein the third conductive node is between the first conductive node and the first I/O interconnect; and
a fourth conductive node coupled to the second I/O interconnect; wherein the fourth conductive node is between the second conductive node and the second I/O interconnect.

12. The device of claim 11, further comprising:
a PCB comprising:
a first communication path coupled to the second I/O interconnect and to the first I/O interconnect to communicate the integrity check signal from the first I/O interconnect to the second I/O interconnect.

13. The device of claim 6, wherein the device is a packaged device comprising:
the first I/O interconnect;
the second I/O interconnect;
an integrated circuit package substrate to which the integrated circuit die is attached, the integrated circuit package substrate comprising:
a third conductive node coupled to the first I/O interconnect, wherein the third conductive node is between the first conductive node and the first I/O interconnect; and
a fourth conductive node coupled to the second I/O interconnect; wherein the fourth conductive node is between the second conductive node and the second I/O interconnect.

14. The device of claim 13, further comprising:
a PCB comprising:
a first communication path coupled to the second I/O interconnect and to the first I/O interconnect to communicate the integrity check signal from the first I/O interconnect to the second I/O interconnect.

15. The device of claim 7, wherein the device is a packaged device comprising:
the first I/O interconnect;
the second I/O interconnect;
an integrated circuit package substrate to which the integrated circuit die is attached, the integrated circuit package substrate comprising:
a third conductive node coupled to the first I/O interconnect, wherein the third conductive node is between the first conductive node and the first I/O interconnect; and
a fourth conductive node coupled to the second I/O interconnect; wherein the fourth conductive node is between the second conductive node and the second I/O interconnect.

16. The device of claim 15, further comprising:
a PCB comprising:
a first communication path coupled to the second I/O interconnect and to the first I/O interconnect to communicate the integrity check signal from the first I/O interconnect to the second I/O interconnect.

17. The device of claim 8, wherein the device is a packaged device comprising:
the first I/O interconnect;
the second I/O interconnect;
an integrated circuit package substrate to which the integrated circuit die is attached, the integrated circuit package substrate comprising:
a third conductive node coupled to the first I/O interconnect, wherein the third conductive node is between the first conductive node and the first I/O interconnect; and
a fourth conductive node coupled to the second I/O interconnect; wherein the fourth conductive node is between the second conductive node and the second I/O interconnect.

18. The device of claim 17, further comprising:
a PCB comprising:
   a first communication path coupled to the second I/O interconnect and to the first I/O interconnect to communicate the integrity check signal from the first I/O interconnect to the second I/O interconnect.

* * * * *